United States Patent [19]
Takiguchi et al.

[11] Patent Number: 5,361,271
[45] Date of Patent: Nov. 1, 1994

[54] SEMICONDUCTOR LASER

[75] Inventors: Haruhisa Takiguchi; Kazuhiko Inoguchi; Hiroaki Kudo; Satoshi Sugahara; Mototaka Taneya, all of Nara, Japan

[73] Assignee: Sharp Kabushiki Kaisha, Japan

[21] Appl. No.: 120,277

[22] Filed: Sep. 13, 1993

[30] Foreign Application Priority Data

Sep. 14, 1992 [JP] Japan .................. 4-245079

[51] Int. Cl.⁵ .............................................. H01S 3/19
[52] U.S. Cl. ........................................ 372/46; 372/45
[58] Field of Search ................................ 372/45, 46

[56] References Cited

U.S. PATENT DOCUMENTS

| | | | |
|---|---|---|---|
| 4,416,012 | 11/1983 | Botez et al. | 372/45 |
| 4,581,742 | 4/1986 | Botez | 372/45 |
| 4,860,298 | 8/1989 | Botez et al. | 372/45 |
| 5,276,700 | 1/1994 | Jansen et al. | 372/50 |

FOREIGN PATENT DOCUMENTS

| | | |
|---|---|---|
| 1-289184 | 11/1989 | Japan . |
| 1-289185 | 11/1989 | Japan . |
| 1-304793 | 12/1989 | Japan . |
| 2-202085 | 8/1990 | Japan . |

OTHER PUBLICATIONS

U.S. Patent Application Ser. No. No. 07/939,901 to Takiguchi et al. (filed Sep. 4, 1992).
Coleman, J. J., et al., "Single-longitudinal-mode metal-organic chemical-vapor-deposition self-aligned GaAlAs-GaAs double-heterostructure lasers" *Applied Physics Letters* 37(3):262-263, Aug. 1980.
Yamamoto, S., et al., "Visible GaAlAs V-channeled substrate inner stripe laser with stabilized mode using pGaAs substrate" *Applied Physics Letters* 40(5):372-374, Mar., 1982.
Ishikawa, H., et al., "Mode-stabilized separated multi-clad layer stripe geometry GaAlAs double heterostructure laser" *Applied Physics Letters* 36(7):520-522, Apr. 1980.

*Primary Examiner*—James W. Davie
*Attorney, Agent, or Firm*—Morrison & Foerster

[57] ABSTRACT

A semiconductor laser of the present invention includes: a semiconductor substrate, a multi-layered structure formed on the semiconductor substrate and a current and light confining section formed on the multi-layered structure, wherein the current and light confining section includes at least two multi-layered current and light confining portions each having a laser beam transmission layer and a laser beam absorption layer formed on the laser beam transmission layer, and at least one stripe groove which spatially separates the at least two current and light confining portions; wherein an equivalent refractive index in the multi-layered current and light confining portions with respect to a laser beam in a fundamental transverse mode is made smaller than that within the stripe groove; wherein the multi-layered structure includes an active layer, and the active layer has a region positioned below the stripe groove of the current and light confining section and regions positioned below a respective one of the multi-layered current and light confining portions; and wherein a optical confinement factor Γ of the active layer outside the stripe groove with respect to a laser beam in a guide mode is larger than that outside the stripe groove with respect to a laser beam in an anti-guide mode.

24 Claims, 11 Drawing Sheets

SEMICONDUCTOR LASER

BACKGROUND OF THE INVENTION

1. Field of the Invention:

The present invention relates to a semiconductor laser, and more particularly to a III-V group compound semiconductor laser.

2. Description of the Related Art:

FIG. 8 shows a cross-sectional view of an AlGaAs/GaAs laser as an example of a conventional III-V group compound semiconductor laser (see FIG. 1 of J.J. Coleman et al., Applied Physics Letters, Vol. 37, No. 3, pp. 262-263, (1980)).

In FIG. 8, A1 is an n-GaAs substrate, A2 an n-$Al_xGa_{1-x}As$ (x=0.35) lower cladding layer, A3 a GaAs active layer, A4 a p-$Al_xGa_{1-x}As$ (x=0.35) first upper cladding layer, A5 an n-GaAs layer for confining current and light with respect to the horizontal direction (hereinafter, referred to as "current and light confining layer"), A6 a p-$Al_xGa_{1-x}As$ (x=0.35) second upper cladding layer, and A7 a p-GaAs contact layer.

Hereinafter, a method for fabricating the above-mentioned semiconductor laser will be described.

First, the lower cladding layer A2, the active layer A3, the first upper cladding layer A4, and the current and light confining layer A5 are successively grown on the substrate A1. Then, a channel (strip groove) with a width of 4 μm is formed in the current and light confining layer A5 by etching. After this, the second upper cladding layer A6 and the contact layer A7 are successively grown on the resulting current and light confining layer A5. All of the crystal growth is conducted by the Metal Organic Chemical Vapor Deposition ( MOCVD ) method.

Next, the operation of the above-mentioned semiconductor laser will be described.

When a voltage is applied between the contact layer A7 and the substrate A1, a forward current flows within the stripe groove of the current and light confining layer A5, through the forward biased pn junction between the first upper cladding layer A4 and the active layer A3. A region including the current and light confining layer A5 outside the stripe groove has pnpn-junctions, so that a reverse bias is applied between the current and light confining layer A5 and the first upper cladding layer A4, resulting in no current flow therebetween. Thus, the current is confined within the stripe groove. In addition, since the layers including the current and light confining layer A5 outside the stripe groove have a smaller equivalent refractive index than that of the layers within the stripe groove because of the light absorption by the layers outside the stripe groove, a laser beam is optically confined within the stripe groove.

FIG. 9 shows another conventional example of a semiconductor laser (see S. Yamamoto et al., Applied Physics Letters, Vol. 40, No. 5, pp. 372-374, (1982)).

In FIG. 9, B1 is a p-GaAs substrate, B2 an n-GaAs current and light confining layer, B3 a p-$Al_xGa_{1-x}As$ (x=0.4) lower cladding layer, B4 an $Al_xGa_{1-x}As$ (x=0.13) active layer, B5 a p-$Al_xGa_{1-x}As$ (x=0.4) upper cladding layer, and B6 a p-GaAs contact layer.

A method for fabricating the above-mentioned semiconductor laser will be described.

First, the current and light confining layer B2 is grown on the substrate B1, and after that a channel (stripe groove) with a width of 4 μm is formed in the current and light confining layer B2 by etching until it reaches the surface region of the substrate B1. Then, the lower cladding layer B3, the active layer B4, the upper cladding layer B5, and the contact layer B6 are successively grown on the resulting current and light confining layer B2. The crystal growth in this conventional example is conducted by the Liquid Phase Epitaxy (LPE) method. The current and light confining structure of this laser is substantially the same as that of FIG. 8.

In the case of the above-mentioned two conventional examples, an n-GaAs single layer is used as the current and light confining layer. Hereinafter, a conventional example in which a multi-layer is used as the current and light confining layer (see Japanese Laid-Open Patent Publication No. 1-304793) is shown in FIG. 10. In FIG. 10, C1 is an n-GaAs substrate, C2 an n-AlGaAs lower cladding layer, C3 an active layer, C4 a p-AlGaAs upper cladding layer, C5 an N-GaAs melt-back layer, C6 an n-$Al_xGa_{1-x}As$ (x=0.4) etching stop layer, C7 an n-GaAs current blocking layer, C8 an n-$Al_xGa_{1-x}As$ (x=0.4) anti-melt-back layer, C9 an n-GaAs melt-back layer, C10 a p-AlGaAs cap layer, and C11 a p-GaAs contact layer. A method for fabricating this type of semiconductor laser is almost the same as that of FIG. 8 except that selective etching is used for the purpose of improving controllability of a stripe depth. Because of this, the etching stop layer C6 is provided. In addition, when a stripe groove is formed by etching, the melt-back layer C5 is retained, and the melt-back layer C5 is removed by melting back at the time of the second growth. Thus, the melt-back layer C5 prevents a regrowth interface (i.e., the surface of the upper cladding layer C4 within the stripe groove) from deteriorating at the time of the second growth. The second growth is conducted by the LPE method. The anti-melt-back layer C8 prevents the current blocking layer C7 from being melted back, and the melt-back layer C9 facilitates the crystal regrowth above the anti-melt-back layer C8.

Next, another conventional example in which a multi-layer is used as the current and light confining layer is shown in FIG. 11 (see H. Ishikawa et al., Applied Physics Letters, Vol. 36, No. 7, pp. 520-522, (1980)). In FIG. 11, D1 is an n-GaAs substrate, D2 a p-$Al_xGa_{1-x}xAs$ (x=0.32, thickness $d_{D2}$=0.7 μm ) current and light confining layer, D3 an n-GaAs (thickness $d_{D3}$=0.1 to 0.2 μm) current and light confining layer, D4 an n-$Al_xGa_{1-x}As$ (x=0.32) cladding layer, D5 a p-$Al_xGa_{1-x}As$ (x=0.05) active layer, D6 a p-$Al_xGa_{1-x}As$ (x=0.32) cladding layer, and D7 a p-GaAs contact layer. A method for producing this type of semiconductor laser is almost the same as that of FIG. 10 except that the current and light confining layer is formed of two layers.

Conventional semiconductor lasers have the structures shown in FIGS. 8 to 11 and have been put into practice. However, the inventors extensively studied the above-mentioned semiconductor lasers; as a result, they found the following four critical problems.

(Problem 1)

In the conventional examples shown in FIGS. 8 and 9, a current and light confining mechanism depends on a pn reverse bias between the n-GaAs current and light confining layer and the cladding layer excluding the stripe groove channel. FIG. 4 shows a band diagram of the pnpn-junctions of the semiconductor laser shown in FIG. 8 at the thermal equilibrium state. The semiconductor laser shown in FIG. 8 is made of layers whose material and mixed crystal composition are different from those of the semiconductor laser shown in FIG. 9. However, the relative size of each band gap in the respective semiconductor lasers is the same. Because of the requirements for the light confining layer described later, the band gap $E_{g2}$ of the current and light confining layer is made sufficiently smaller than the band gap $E_{g1}$ of the active layer. Since holes in the p-type cladding layer do not flow due to a valence band barrier of the n-GaAs current and light confining layer against thereto, a current is confined in the current and light confining layer. In these conventional examples, the current and light confining layer is made of n-GaAs and has a small band gap (i.e., $E_{g2}=1.42$ eV). Thus, the height of the barrier is not large. In addition, because of the relationship $E_{g1} \geq E_{g2}$, laser light generated in the active layer is absorbed in the current and light confining layer. Electrons and holes are generated as a result of the absorption of the laser beam, and the holes (minority carriers) diffuse and disappear from the current and light confining layer, whereby only the electrons remain in this layer. When the current and light confining layer is turned on by a phototransistor effect, a current and light confining function is completely lost. In order to overcome this drawback, in the conventional examples, it is required that the thickness of the current and light confining layer is made larger than a diffusion length of the minority carriers. Because of this, even if the current and light confining layer is made of n-GaAs so as to make holes whose diffusion length is short (approximately 1 μm) the minority carriers, the thickness of the current and light confining layer should be about 1 μm. On the other hand, when the current and light confining layer is made of p-GaAs, the thickness of the current and light confining layer should be made even thicker because of a long diffusion length of the electrons (approximately 2 μm).

As described above, it was found that there had been tremendous restrictions on the design of a layer structure. Therefore, in the case where the current and light confining layer is as thick as 1 μm, and a stripe groove is formed through this layer, an etching time becomes long and the amount of etched side walls of the stripe groove becomes large, resulting in the stripe with a width larger than the desired one.

(Problem 2)

The optical confining of a laser beam in a transverse mode in the above-mentioned four conventional examples is conducted by the absorption of the laser beam in the n-GaAs current and light confining layer. More particularly, there is the following relationship among a real part $\epsilon_r$ of a complex dielectric constant $\epsilon$, a refractive index n, and an attenuation coefficient k of each layer:

$$\epsilon_r/\epsilon_o = n^2 - k^2$$

A refractive index with respect to a laser beam in a certain mode (i.e., an equivalent refractive index) depends on a complex dielectric constant of each layer. According to the above equation, in the current and light confining layer, $\epsilon_r$ becomes small, so that an equivalent refractive index becomes small. Because of this, the equivalent refractive index outside the stripe groove is smaller than that within of the stripe groove; as a result, a laser beam in a transverse mode is optically confined within the stripe groove. However, in the conventional examples in FIGS. 8 and 9, the current and light confining layer should be as thick as 1 μm for the reason described in Problem 1. Therefore, the laser beam in the optically confined transverse mode will be excessively absorbed by the current and light confining layer.

Moreover, in FIG. 10, due to the presence of the etching stop layer C6, the current blocking layer C7 could have been made thin. However, since this problem was not taken into consideration until it was pointed out in the present specification, the thickness d of the current blocking layer C7 was set in the range of $0.3 \leq d \leq 2$ μm. As described later, unless the thickness of the current blocking layer C7 is made equal to or less than half of a reciprocal of an absorption coefficient ($\alpha$) with respect to the laser lasing wavelength of this layer, i.e., $\frac{1}{2}$ (0.25 μm at $\lambda=780$ nm), the optically confined laser beam in a transverse mode is excessively absorbed. Thus, in the semiconductor laser in FIG. 10, the laser beam in a transverse mode is excessively absorbed in a similar way to the conventional examples in FIGS. 8 and 9.

As described above, it was found that the absorption loss of the laser beam in a transverse mode in the conventional examples becomes excessive. If the loss by absorption is great, an external differential quantum efficiency is decreased, so that a driving current is increased at the time of a high output operation, reducing the reliability of the semiconductor laser. Thus, it was found that it is effective for the improvement of reliability of the high output operation, when the absorption loss can appropriately be reduced.

(Problem 3)

In the conventional example of FIG. 10, the control of the equivalent refractive index within and outside the stripe groove is not taken into consideration. Because of this, a laser beam in an anti-guide mode, in which the equivalent refractive index outside the stripe groove is larger than that within the stripe groove, is strongly coupled to a laser beam within the stripe groove. As a result, the semiconductor laser cannot function in a normal manner. More specifically, the conventional example in FIG. 10 has a problem that the difference in equivalent refractive index within the stripe groove from that outside the stripe groove cannot be controlled.

In the conventional example in FIG. 11, the current and light confining layer D3 and the cladding layer D4 have the same conductivity type, so that there is no effect of current and light confining. Thus, the diffusion of the current up to the active layer D5 is large. In addition, even if the current and light confining layer D3 had a conductivity type different from that of the cladding layer D4, since the current and light confining layer D3 is thin (i.e., $d_{D3}=0.1$ to 0.2 μm), the current and light confining layer D3 is turned on due to a phototransistor effect and there is no effect of current and light confining. Furthermore, the difference in equivalent refractive index within the stripe groove from that outside the stripe groove and the absorption loss, which determine behavior of the laser beam in a transverse mode, are determined only by the thickness of the current and light confining layer D3 and that of the cladding layer D4, as described in detail in the cited reference. Thus, the desired difference in equivalent refractive index cannot be regulated, independent of the loss by absorption.

(Problem 4)

As described in Problem 2, the absorption loss of a laser beam in a mode which propagates outside the stripe groove is large, so that a wave front of the laser beam in the mode which propagates outside the stripe groove is remarkably delayed compared with that within the stripe. The delay of a wave front causes an astigmatic difference and has an adverse effect on an image-formation characteristic.

SUMMARY OF THE INVENTION

A semiconductor laser of the present invention includes a semiconductor substrate, a multi-layered structure formed on the semiconductor substrate and a current and light confining section formed on the multi-layered structure, wherein the current and light confining section includes at least two multi-layered current and light confining portions each having a laser beam transmission layer and a laser beam absorption layer formed on the laser beam transmission layer, and at least one stripe groove which spatially separates the at least two current and light confining portions;

wherein an equivalent refractive index in the multi-layered current and light confining portions with respect to a laser beam in a fundamental transverse mode is made smaller than that within the stripe groove;

wherein the multi-layered structure includes an active layer, and the active layer has a region positioned below the stripe groove of the current and light confining section and regions positioned below a respective one of the multi-layered current and light confining portions; and wherein a optical confinement factor $\Gamma$ of the active layer outside the stripe groove with respect to a laser beam in a guide mode is larger than that outside the stripe groove with respect to a laser beam in an anti-guide mode.

According to another aspect of the present invention, a semiconductor laser includes a semiconductor substrate, a current and light confining section formed on the semiconductor substrate, and a multi-layered structure formed on the current and light confining section, wherein the current and light confining section includes at least two multi-layered current and light confining portions having a laser beam absorption layer and a laser beam transmission layer formed on the laser beam absorption layer, and at least one stripe groove which spatially separates the current and light confining portions;

wherein an equivalent refractive index in the multi-layered current and light confining portions with respect to a laser beam in a fundamental transverse mode is made smaller than that within the stripe groove;

wherein the multi-layered structure includes an active layer, and the active layer has a region positioned above the stripe groove of the current and light confining section and regions positioned above respective one of the multi-layered current and light confining portions; and wherein a optical confinement factor $\Gamma$ of the active layer outside the stripe groove with respect to a laser beam in a guide mode is larger than that outside the stripe groove with respect to a laser beam in an anti-guide mode.

In one embodiment of the present invention, the multi-layered current and light confining portions further include another laser beam transmission layer formed adjacent to the laser beam absorption layer.

In another embodiment of the present invention, a refractive index in the laser beam transmission layer is smaller than the equivalent refractive index in the multi-layered current and light confining portions with respect to the laser beam in the fundamental transverse mode.

In another embodiment of the present invention, at least either one of the refractive index of the laser beam transmission layer or the equivalent refractive index of the another laser beam transmission layer is smaller than the equivalent refractive index in the multi-layered current and light confining portions with respect to the laser beam in the fundamental mode.

In another embodiment of the present invention, a band gap of the laser beam transmission layer is larger than that of the active layer, and a band gap of the laser beam absorption layer is smaller than that of the active layer.

In another embodiment of the present invention, any of the band gap of the laser beam transmission layer and the another laser beam transmission layer is larger than that of the active layer, and the band gap of the laser beam absorption layer is smaller than that of the active layer.

In another embodiment of the present invention, a thickness of the laser beam absorption layer is equal to or less than ½ of a reciprocal of an absorption coefficient of the laser beam absorption layer with respect to a laser lasing wavelength.

In another embodiment of the present invention, the thickness of the laser beam absorption layer is equal to or less than a diffusion length of minority carriers in the laser beam absorption layer.

In another embodiment of the present invention, the multi-layered structure, the laser beam transmission layer, and the laser beam absorption layer are $Al_xGa_{1-x}As$ layers; and a mole fraction x of the laser beam transmission layer is set so that a optical confinement factor $\Gamma$ of the active layer outside the stripe groove with respect to the laser beam in the guide mode is made larger than that outside the stripe groove with respect to the laser beam in the anti-guide mode.

In another embodiment of the present invention, the multi-layered structure, the laser beam transmission layer, and the laser beam absorption layer are $(Al_xGa_{1-x})_{0.5}In_{0.5}P$ layers; and a mole fraction x of the laser beam transmission layer is set so that a optical confinement factor $\Gamma$ of the active layer outside the stripe groove with respect to the laser beam in the guide mode is made larger than that outside the stripe groove with respect to the laser beam in the anti-guide mode.

Thus, the invention described herein makes possible the advantages of (1) providing a semiconductor laser with an improved current and light confining function; (2) providing a semiconductor laser in which absorption loss of a laser beam with respect to the horizontal direction is reduced, thereby improving the reliability of the laser at the time of the high output operation thereof; (3) providing a semiconductor laser in which the difference in equivalent refractive index within a stripe groove from that outside the stripe groove can be regulated in a wide range; and (4) providing a semiconductor laser in which delay of a wave surface outside the stripe groove can be prevented, whereby astigmatism is reduced, resulting in improved optical characteristics of a laser beam.

These and other advantages of the present invention will become apparent to those skilled in the art upon reading and understanding the following detailed description with reference to the accompanying FIGURES.

BRIEF DESCRIPTION OF THE DRAWINGS

FIG. is a cross-sectional view of a first example of a laser according to the present invention.

DESCRIPTION OF THE PREFERRED EMBODIMENTS

Hereinafter, preferred embodiments of the present invention will be described by way of illustrative example with reference to the drawings.

Example 1

Figure 1:
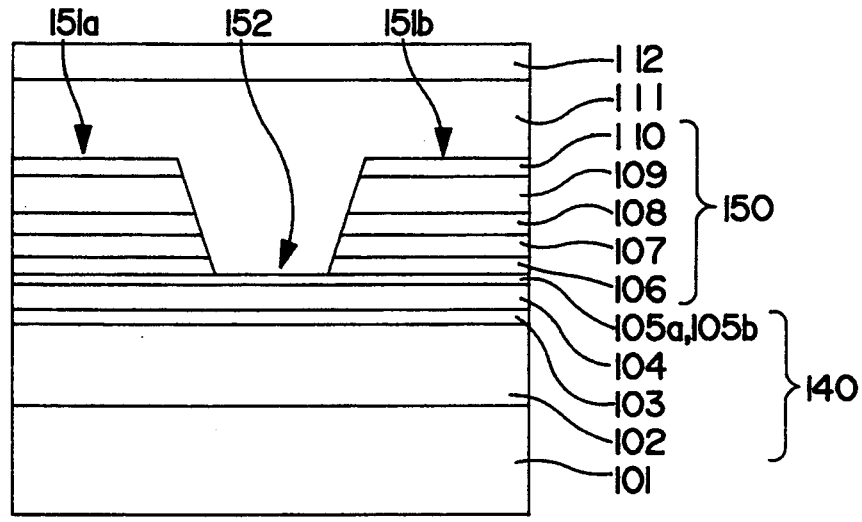

A semiconductor laser according to the present invention shown in FIG. 1 includes a semiconductor substrate 101, a multi-layered structure 140 formed on the semiconductor substrate 101, and a current and light confining section 150 (i.e., a section for confining current and light with respect to the horizontal direction) formed on the multi-layered structure 140.

The multi-layered structure 140 includes, a first cladding layer 102 formed on the semiconductor substrate 101, an active layer 103 formed on the first cladding layer 102, a second cladding layer 104 formed on the active layer 103, and epitaxial growth promoting layers 105a and 105b formed on the second cladding layer 104.

The current and light confining section 150 has two multi-layered current and light confining portions 151a and 151b, and a stripe groove 152 which spatially divides the current and light confining section 150 into the current and light confining portions 151a and 151b. The current and light confining portions 151a and 151b include an etching stop layer 106, a laser beam transmission layer 107, a laser beam absorption layer 108, another laser beam transmission layer 109, and another epitaxial growth promoting layer 110 in this order from the bottom. The band gaps of the laser beam transmission layers 107 and 109 are made larger than that of the active layer 103 so that the laser beam transmission layers 107 and 109 allow a laser beam to pass therethrough. In addition, the band gap of the laser beam absorption layer 108 is made smaller than that of the active layer 103 so that the laser beam absorption layer 108 absorbs a laser beam.

Among the respective above-mentioned compound semiconductor layers, the laser beam transmission layers 107 and 109 have a function completely different from that of the etching stop layer C6 and the anti-meltback layer C8 of the conventional semiconductor laser.

A cladding layer 111 is formed so as to cover the current and light confining portions 151a and 151b, and the stripe groove 152. The upper surface of the cladding layer 111 is made substantially flat and covered with a contact layer 112. The active layer 103 has a region positioned below the stripe groove 152 of the current and light confining section 150 and a region positioned below the current and light confining portions 151a and 151b. Here, electrodes are omitted in FIG. 1 (and other FIGURES) to simplify the description.

Figure 2:
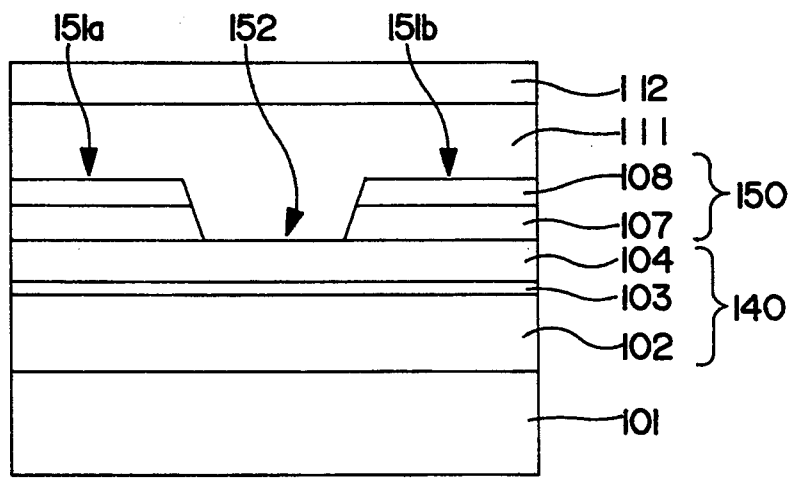
FIG. 2 is a cross-sectional view of main portions of the first example illustrating the function thereof.
Figure 3:
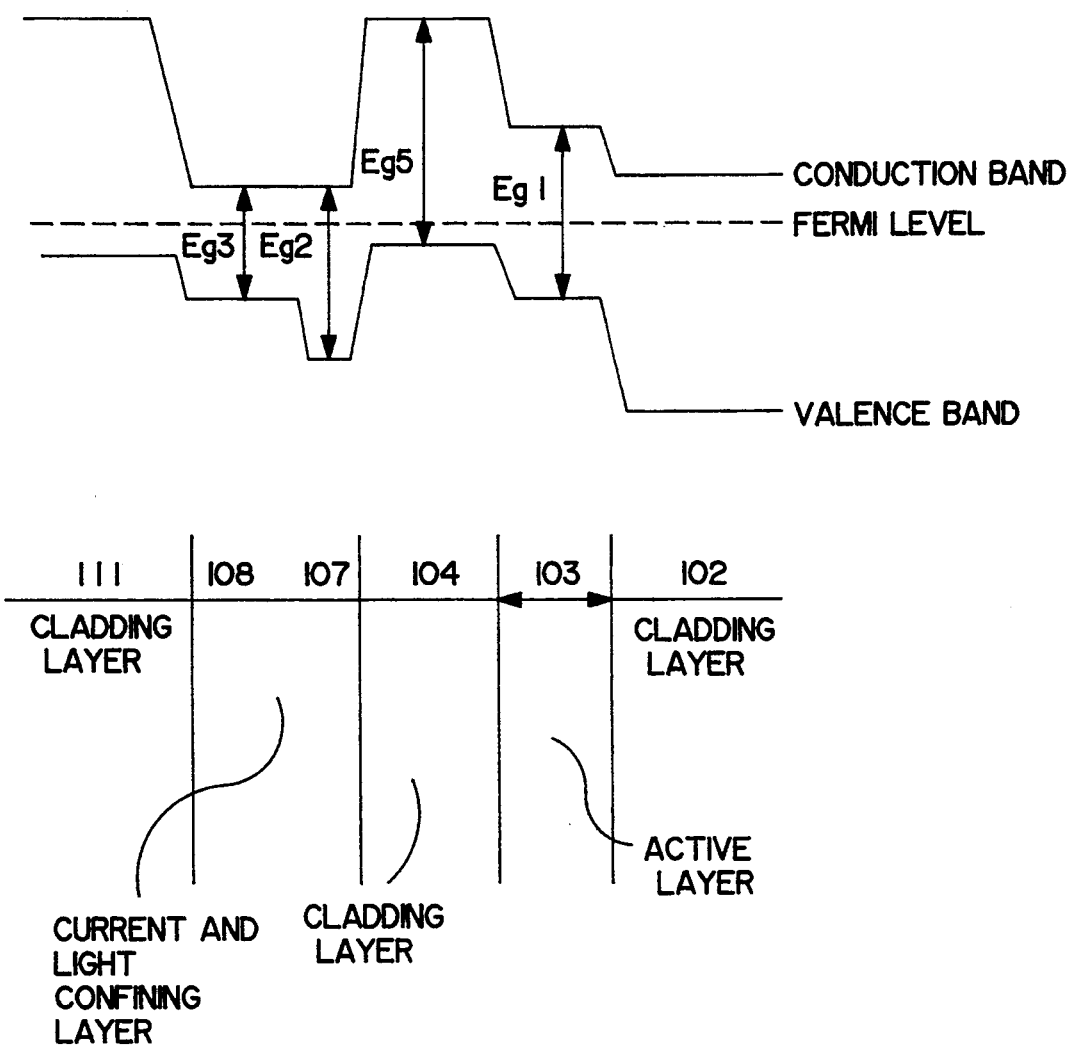
FIG. 3 is a band energy diagram of the semiconductor laser shown in FIG. 2.
Figure 4:
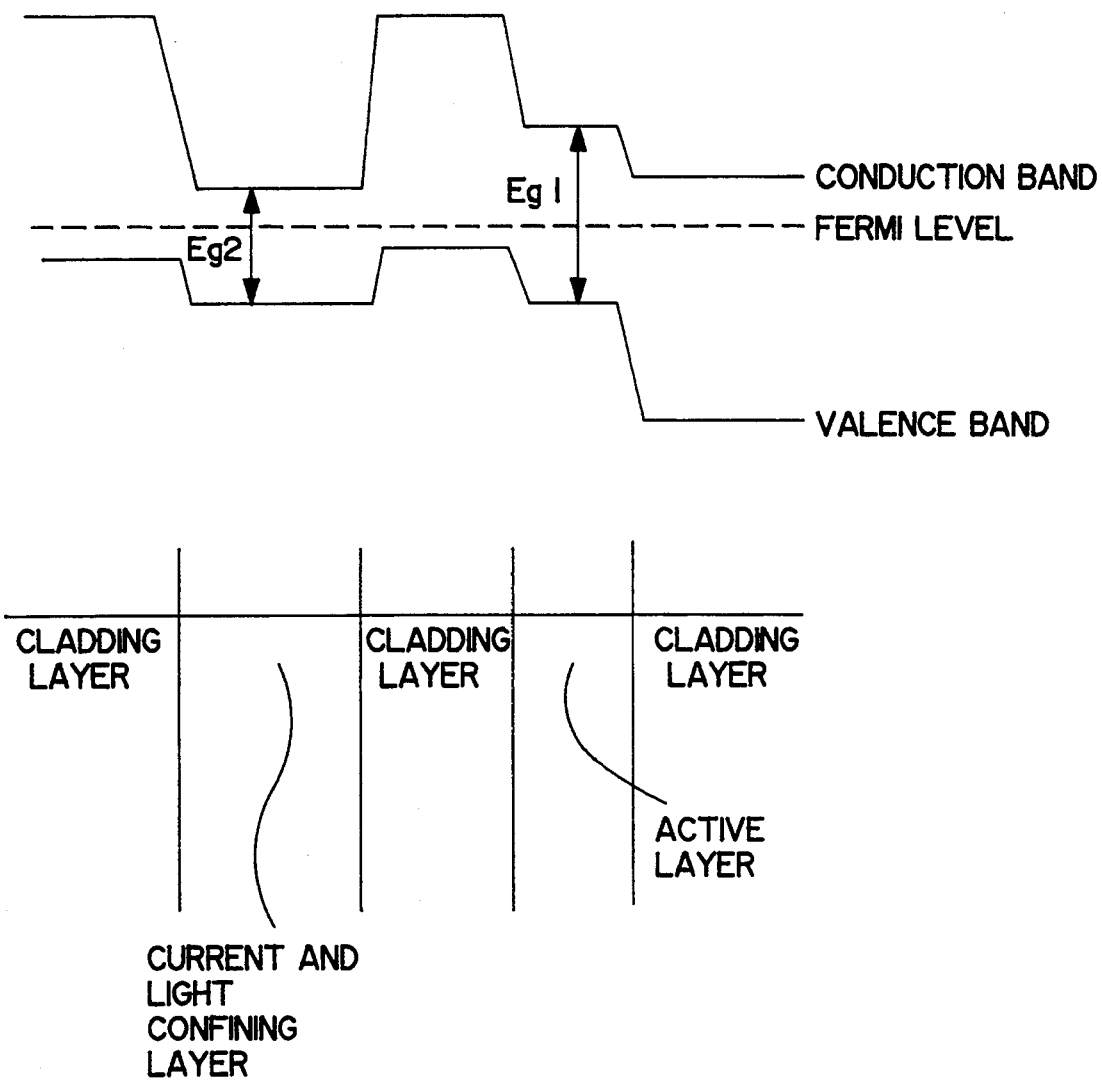
FIG. 4 is a band energy diagram of a conventional semiconductor laser.

FIG. 2 is a cross-sectional view of the semiconductor laser of FIG. 1, illustrating the main portions thereof. In FIG. 2, the epitaxial growth promoting layers 105a, 105b, and 110, the etching stop layer 106, and the laser beam transmission layer 109 are omitted for simplicity. These omitted layers are not required for obtaining a current and light confining function. FIG. 3 shows a band diagram of the region outside the stripe groove shown in FIG. 2. In the current and light confining portions 151a and 151b, the laser beam transmission layer 107 forms a barrier. In this respect, the band diagram of FIG. 2 is different from that of FIG. 4.

Figure 5:
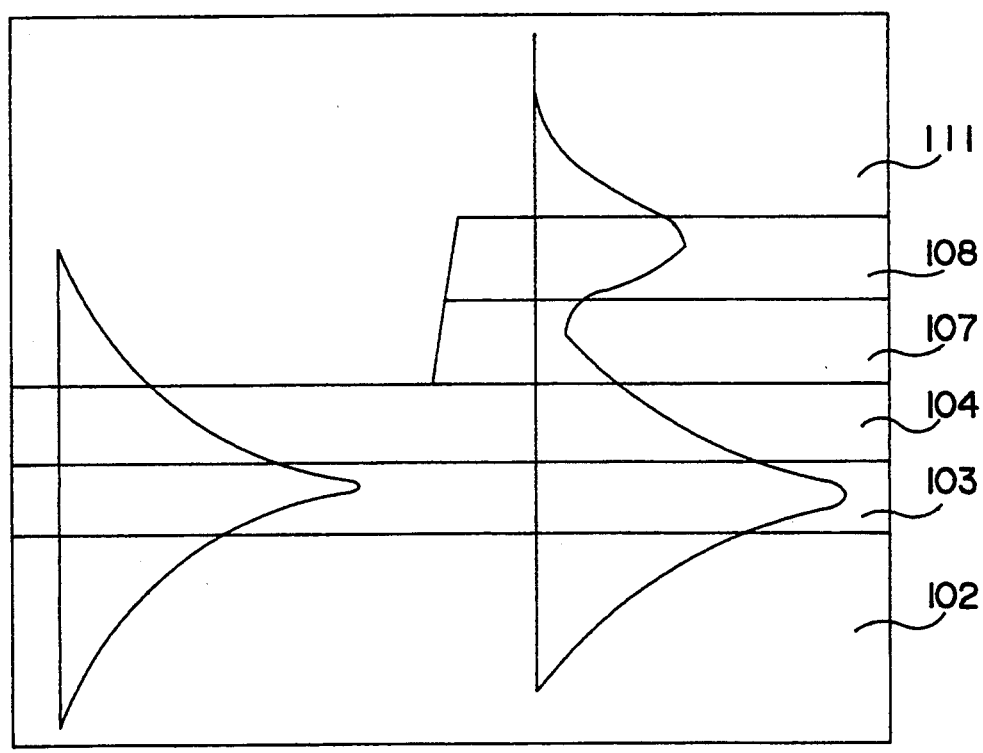
FIG. 5 is a schematic diagram showing a light intensity distribution within and outside a stripe groove in the first example.

As described later, a composition and a thickness of each compound semiconductor layer are determined so that the equivalent refractive index in the current and light confining portions 151a and 151b with respect to a laser beam in a fundamental transverse mode (i.e., a laser beam in a fundamental mode with respect to the horizontal direction) is made smaller than that within the stripe groove 152. FIG. 5 shows a light intensity distribution within and outside the stripe groove 152 of the semiconductor laser of FIG. 2.

Next, examples of a composition and a thickness of each compound semiconductor layer forming the semiconductor laser of FIG. 1 are shown in Tables 1 and 2. Numerical values represented by "$d_{102}$ to $d_{112}$" are the thickness of each layer. "UN" denotes an undoped state.

TABLE 1

| 101 | n-GaAs | |
|---|---|---|
| 102 | n-$Al_xGa_{1-x}As$(x = 0.5) | $d_{102}$ = 1.0 μm |
| 103 | un-$Al_xGa_{1-x}As$(x = 0.13) | $d_{103}$ = 0.08 μm |
| 104 | p-$Al_xGa_{1-x}As$(x = 0.5) | $d_{104}$ = 0.2 μm |
| 105a | p-$Al_xGa_{1-x}As$(x = 0.25) | $d_{105a}$ = 0.1 nm |
| 105b | p-GaAs | $d_{105b}$ = 0.003 μm |
| 106 | p-$Al_xGa_{1-x}As$(x = 0.6) | $d_{106}$ = 0.0 nm |
| 107 | n-$Al_xGa_{1-x}As$(x = 0.2 - 0.5) | $d_{107}$ = 0.2 μm |
| 108 | n-GaAs | $d_{108}$ = 0.16 μm |
| 109 | n-$Al_xGa_{1-x}As$(x = 0.2, 0.4) | $d_{109}$ = 0.04 μm |
| 110 | n-GaAs | $d_{110}$ = 0.0 μm |
| 111 | p-$Al_xGa_{1-x}As$(x = 0.65) | $d_{111}$ = 1.0 μm |
| 112 | p-GaAs | $d_{112}$ = 1.0 μm |

TABLE 2

| 101 | n-GaAs | |
|---|---|---|
| 102 | n-$(Al_xGa_{1-x})_{0.5}In_{0.5}P$(x = 1.0) | $d_{102}$ = 1.0 μm |
| 103 | un-$(Al_xGa_{1-x})_{0.5}In_{0.5}P$(x = 0.26) | $d_{103}$ = 0.08 μm |
| 104 | p-$(Al_xGa_{1-x})_{0.5}In_{0.5}P$(x = 1.0) | $d_{104}$ = 0.2 μm |
| 105a | p-$(Al_xGa_{1-x})_{0.5}In_{0.5}P$(x = 0.5) | $d_{105a}$ = 0.1 nm |
| 105b | p-$(Al_xGa_{1-x})_{0.5}In_{0.5}P$(x = 0) | $d_{105b}$ = 0.003 μm |
| 106 | p-$(Al_xGa_{1-x})_{0.5}In_{0.5}P$(x = 1.0) | $d_{106}$ = 0.0 nm |
| 107 | n-$(Al_xGa_{1-x})_{0.5}In_{0.5}P$(x = 0.4–1.0) | $d_{107}$ = 0.2 μm |
| 108 | n-GaAs | $d_{108}$ = 0.16 μm |
| 109 | n-$(Al_xGa_{1-x})_{0.5}In_{0.5}P$(x = 0.2, 0.4) | $d_{109}$ = 0.04 μm |
| 110 | n-GaAs | $d_{110}$ = 0.0 μm |
| 111 | p-$(Al_xGa_{1-x})_{0.5}In_{0.5}P$(x = 1.0) | $d_{111}$ = 1.0 μm |
| 112 | p-GaAs | $d_{112}$ = 1.0 μm |

According to an $Al_xGa_{1-x}As$ semiconductor laser having compound semiconductor layers shown in Table 1, a laser beam having a lasing wavelength of 780 nm is obtained. In contrast, according to an $(Al_xGa_{1-x})_{0.5}In_{0.5}P$ semiconductor laser having compound semiconductor layers shown in Table 2, a laser beam having a lasing wavelength of 670 nm is obtained.

Next, a method for producing a semiconductor laser of FIG. 1 will be described using the case where an $Al_xGa_{1-x}As$ semiconductor laser having each compound semiconductor layer shown in Table 1 is produced.

First, the first cladding layer 102, the active layer 103, the second cladding layer 104, the epitaxial growth promoting layers 105a and 105b, the etching stop layer 106, the laser beam transmission layer 107, the laser beam absorption layer 108, the laser beam transmission layer 109 and the epitaxial growth promoting layer 110 are grown on the semiconductor substrate 101 in this order by an epitaxial growth method. As the epitaxial growth method, the MOCVD method is preferably used; however, other epitaxial growth methods can be used.

Next, the stripe groove 152 (e.g., width: 4 μm, depth: 0.4 μm) reaching the etching stop layer 106 is formed in the laser beam transmission layer 107, the laser beam absorption layer 108, the laser beam transmission layer 109, and the epitaxial growth promoting layer 110 by photolithography and an etching procedure. In the case where the $Al_xGa_{1-x}As$ semiconductor laser having each compound semiconductor layer shown in Table 1 is produced, an ammonia type etchant (NH$_4$OH:-H$_2$O$_2$=1:10) is preferably used for forming the stripe groove 152. When this type of etchant is used, the $As_xGa_{1-x}As$ (x=0.6) etching stop layer 106 is hardly etched. Thus, even though the etching conditions are varied, the stripe groove 152 whose depth is adjusted with good controllability can be formed with satisfactory yield. It is preferred that a mole fraction x of the $Al_xGa_{1-x}As$ etching stop layer 106 is in the range of 0.5 to 0.9.

The above-mentioned etching is conducted until the etching stop layer 106 is exposed, and the exposed etching stop layer 106 is removed with hydrofluoric acid (HF). The epitaxial growth promoting layers 105a and 105b respectively made of p-$Al_xGa_{1-x}As$ (x=0.25) and p-GaAs are hardly etched with HF, so that the only etching stop layer 106 is selectively removed. In this way, as a result of the formation of the stripe groove 152, the current and light confining portions 151a and 151b are provided.

Then, the cladding layer 111 and the contact layer 112 are formed by the epitaxial growth method so as to cover the current and light confining portions 151a and 151b, and the stripe groove 152. Here, in order to facilitate the epitaxial growth, a mole fraction x of the $Al_xGa_{1-x}As$ epitaxial growth promoting layer 110 is preferably in the range of 0 to 0.1. After the formation of the contact layer 112, electrodes (not shown) are formed.

In the case where an $(Al_xGa_{1-x})_{0.5}In_{0.5}P$ semiconductor laser having each compound semiconductor layer shown in Table 2 is produced, the etching stop layer 106 is not required. Because the use of a sulfuric acid type etchant (H$_2$SiO$_4$:H$_2$O$_2$=1:4) makes possible the formation of the stripe groove 152 with good controllability under the condition that the epitaxial growth promoting layer 105b is hardly etched. In order to facilitate the epitaxial growth, a mole fraction x of the $(Al_xGa_{1-x})_{0.5}In_{0.5}P$ epitaxial growth promoting layer 110 is preferably in the range of 0 to 0.2.

Hereinafter, the waveguiding function of the semiconductor laser with a structure shown in FIG. 1 will be described.

First, among a group of modes of a laser beam capable of being transmitted through the region within the stripe groove and the region outside the stripe groove, a fundamental mode within the stripe groove and two modes outside the stripe groove having equivalent refractive indexes ($n_{eo1}$ and $n_{eo2}$) which are close to an equivalent refractive index ($n_{ei}$) within the stripe groove with respect to a laser beam in the fundamental mode are taken into consideration. The mode of a laser beam transmitted through the region within the stripe groove is coupled to the modes of a laser beam also transmitted through the region outside the stripe groove. Among the two modes outside the stripe groove, a mode having the equivalent refractive index ($n_{eo1}$) equal to or less than that ($n_{ei}$) of the fundamental mode within the stripe groove is referred to as a guide mode. Another mode having the equivalent refractive index ($n_{eo2}$) equal to or more than that ($n_{ei}$) of the fundamental mode within the stripe groove is referred to as an anti-guide mode.

When a laser beam in the fundamental mode within the stripe groove is strongly coupled to a laser beam in the guide mode, the coupled laser beam can appropriately be guided within the stripe groove. It is preferred that the difference in equivalent refractive index ($n_{ei} - n_{eo1}$) within the stripe groove from that outside the stripe groove is $1 \times 10^{-2}$ or more. In contrast, when a laser beam in the fundamental mode within the stripe groove is strongly coupled to a laser beam in the anti-guide mode, the coupled laser beam is scattered outside the stripe groove.

Because of this, it is required that a laser beam in the fundamental mode within the stripe groove is strongly coupled to a laser beam in the guide mode. In order that a laser beam in the fundamental mode within the stripe groove is strongly coupled to a laser beam in the guide mode, it is required that a optical confinement factor $\Gamma$ of the active layer of the region within the stripe groove is approximated to that of the region outside the stripe groove.

As described above, the waveguiding function is exhibited when the above-mentioned conditions regarding the equivalent refractive index and the optical confinement factor $\Gamma$ are satisfied. According to the structure of the semiconductor laser of the present invention, it is easy to satisfy the conditions regarding the equivalent refractive index and the optical confinement factor $\Gamma$. More specifically, according to whether a refractive index n of the laser beam transmission layer 107 in the vicinity of the active layer 103 is made larger or smaller than the equivalent refractive index $n_{eq}$, it is possible to lead out a laser beam generated in the active layer 103 ($n \geq n_{eq}$) and to return it to the active layer 103 ($n \geq n_{eq}$). As a result, an electrical field strength distribution in the multi-layered current and light confining portions can arbitrarily be controlled.

Figure 16:
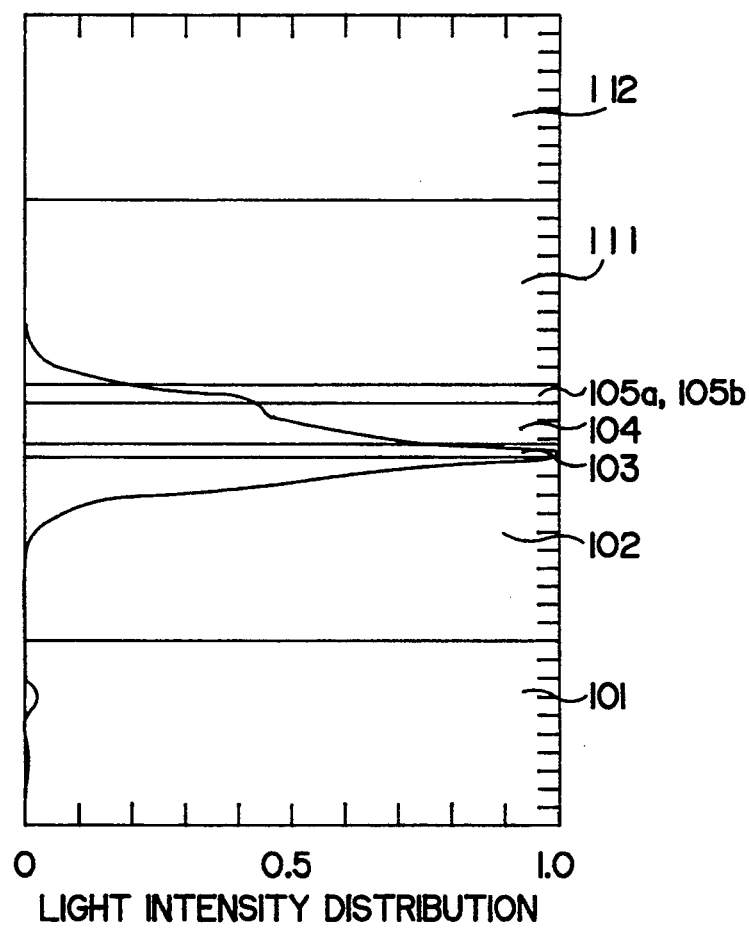
FIG. 16 is a diagram showing a light intensity distribution of a laser beam in a fundamental mode within a stripe groove 152.
Figure 17:
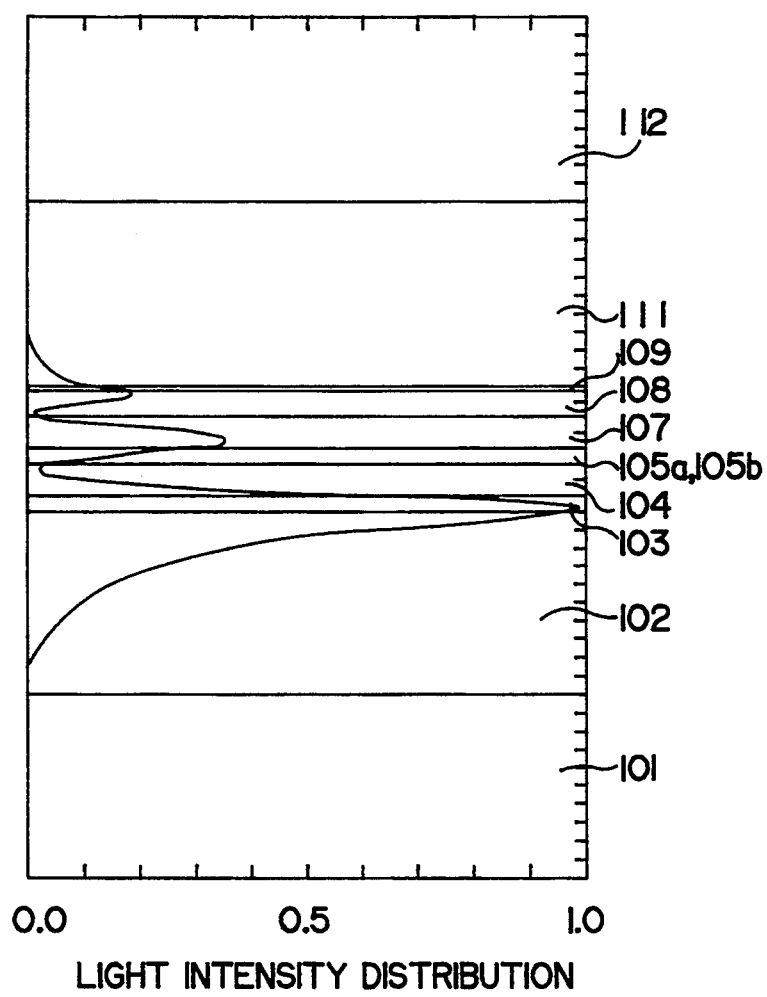
FIG. 17 is a diagram showing a light intensity distribution of a laser beam in a guide mode in the multi-layered confining portions 151a and 151b.
Figure 18:
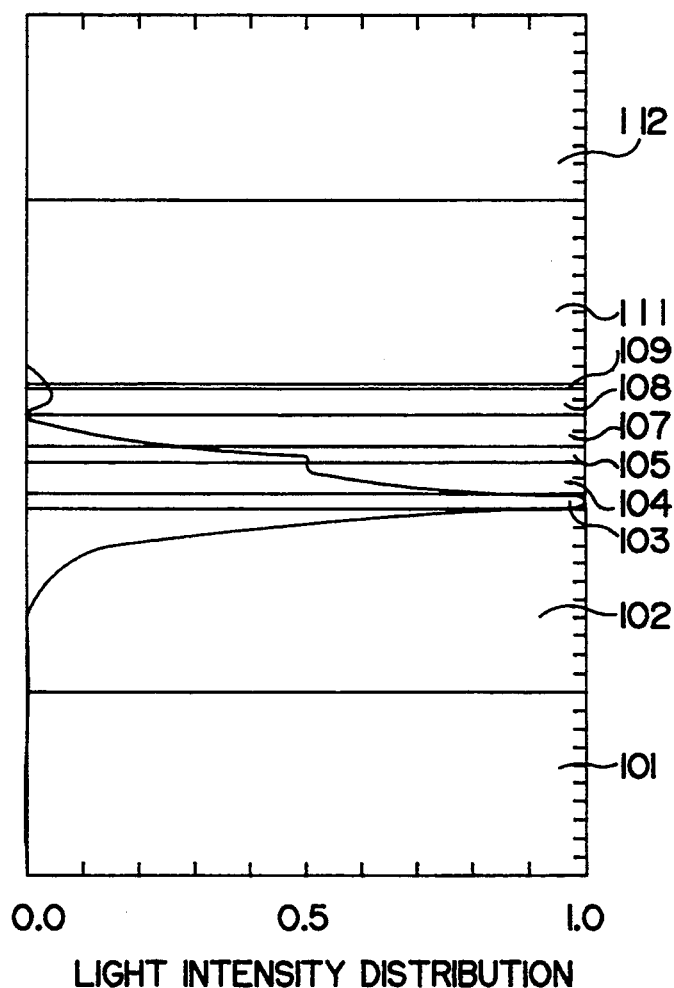
FIG. 18 is a diagram showing a light intensity distribution of a laser beam in an anti-guide mode in the multi-layered light confining portions 151a and 151b.

FIG. 16 shows a light intensity distribution of a laser beam in the fundamental mode within the stripe groove 152. FIG. 17 shows a light intensity distribution of a laser beam in the guide mode of the current and light confining portions 151a and 151b. The current and light confining portions 151a and 151b have the laser beam transmission layers 107 and 109 respectively made of $Al_xGa_{1-x}As$ (x=0.2). As is understood from FIG. 17, the light intensity of the laser beam outside the stripe groove is sufficiently large in the laser beam transmission layers 107 and 109 of the current and light confining portions 151a and 151b, and the difference in refractive index within the stripe groove 152 from that outside the stripe groove 152 becomes sufficient. FIG. 18 shows a light intensity distribution of a laser beam in the anti-guide mode in the current and light confining portions 151a and 151b. The current and light confining portions 151a and 151b have the $Al_xGa_{1-x}As$ (x=0.4) laser beam transmission layer 107 and the $Al_xGa_{1-x}As$ (x=0.5) laser beam transmission layer 109. As is understood from FIG. 18, since the light intensity of the laser beam outside the stripe groove is not sufficiently large in the current and light confining portions 151a and 151b, the light intensity distribution in FIG. 18 is similar to that within the stripe groove 152 of FIG. 16. In addition, regarding the equivalent refractive index, the relationship $n_{ei} \geq n_{eo}$ is obtained. Because of this, according to the waveguide which provides the light intensity distribution shown in FIG. 18, a laser beam is not guided. The light intensity is in proportion to the square of the electrical field strength.

Figure 12:
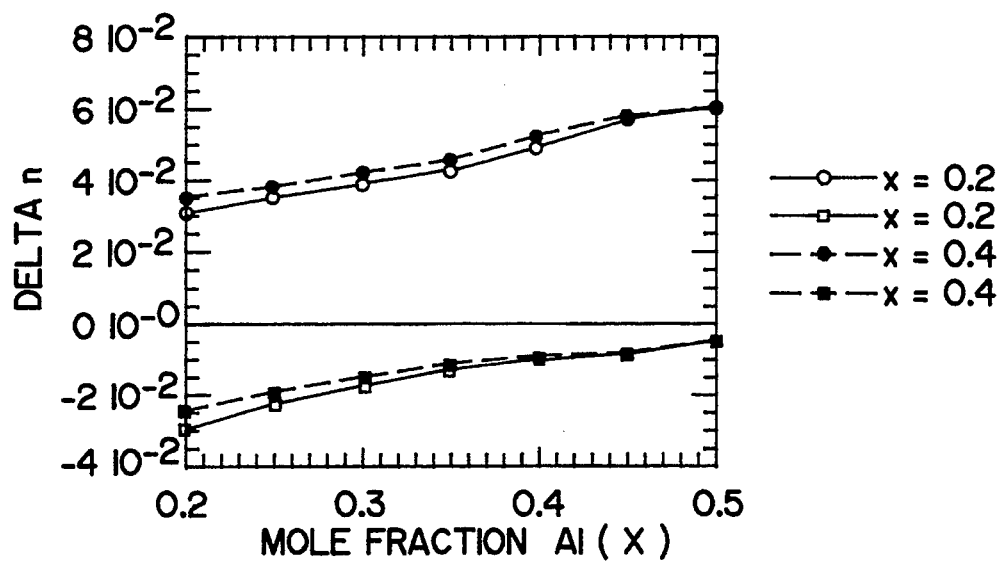
FIG. 12 is a graph showing the relationship between the Al mole fraction Al(x) of an $Al_xGa_{1-x}As$ laser beam transmission layer 107 and the difference in equivalent refractive index within a stripe groove from that outside the stripe groove in Example 1.

Regarding the $Al_xGa_{1-x}As$ semiconductor laser having each compound semiconductor layer shown in Table 1, a relationship between the structure of the current and light confining portions 151a and 151b and the waveguiding function will be described in detail. FIG. 12 shows a relationship between the Al mole fraction Al(x) of the laser beam transmission layer 107 and the difference in equivalent refractive index $\Delta n$ within the stripe groove 152 from that outside the stripe groove 152. Solid lines show the relationship regarding the semiconductor laser (Example 1) in which the Al mole fraction x of the laser beam transmission layer 109 is 0.2; and broken lines show the relationship regarding the semiconductor laser (Example 2) in which the Al mole fraction x of the laser beam transmission layer 109 is 0.4. Regarding the respective semiconductor lasers (Examples 1 and 2), two kinds of refractive index differences $\Delta n$ represented by circular and square marks are shown. The solid and broken lines with the circular marks show differences in the refractive indexes $\Delta n$ of $2 \times 10^{-2}$ or more.

Figure 13:
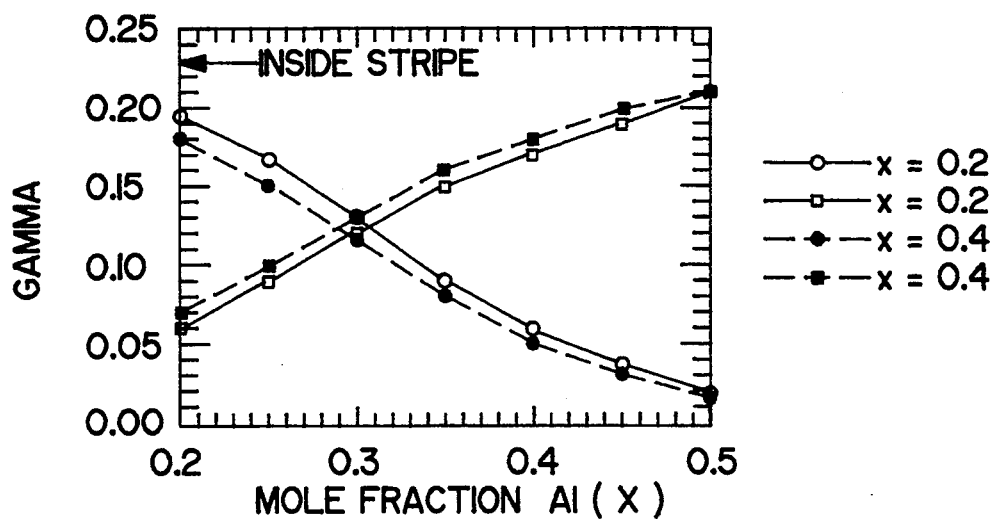
FIG. 13 is a graph showing the relationship between the Al mole fraction Al(x) of the $Al_xGa_{1-x}As$ laser beam transmission layer 107 and the optical confinement factor $\Gamma$ of a region outside a stripe groove of an active layer 103 provided below multi-layered confining portions 151a and 151b.

FIG. 13 shows a relationship between the Al mole fraction Al (x) of the laser beam transmission layer 107 and the optical confinement factor $\Gamma$ of the active layer of the region outside the stripe groove of the active layer 103 positioned below the current and light confining portions 151a and 151b. Solid lines show the relationship regarding the semiconductor laser (Example 1) in which the Al mole fraction x of the laser beam transmission layer 109 is 0.2, and broken lines show the relationship regarding the semiconductor laser (Example 2) in which the Al mole fraction x of the laser beam transmission layer 109 is 0.4. Regarding the respective semiconductor lasers (Examples 1 and 2), two kinds of optical confinement factor $\Gamma$ of the active layers represented by circular and square marks are shown.

The solid line and the broken line which monotonically increase in accordance with the increase in the Al mole fraction Al(x) of the laser beam transmission layer 107 represent optical confinement factor $\Gamma$ of the active layers with respect to a laser beam in the anti-guide mode. On the other hand, the solid line and the broken line which monotonically decrease in accordance with the increase in the Al mole fraction Al(x) of the laser beam transmission layer 107 represent the optical confinement factors $\Gamma$ with respect to a laser beam in the guide mode.

As is apparent from FIG. 13, in the semiconductor laser which has an Al mole fraction Al(x) of the laser beam transmission layer 107 in the range of 0.2 to 0.3, the optical confinement factor $\Gamma$ of the active layer with respect to a laser beam in the guide mode rather than that with respect to a laser beam in the anti-guide mode is closer to the optical confinement factor $\Gamma$ of the active layer (about 0.23) within the stripe groove.

According to the semiconductor laser which has an Al mole fraction Al(x) of the laser beam transmission layer 107 in the range of 0.2 to 0.3, the equivalent refractive index in the current and light confining portions 151a and 151b with respect to a laser beam in the fundamental transverse mode is smaller than that within the stripe groove (the difference in refractive index $\Delta n$ is larger than $1 \times 10^{-2}$). The optical confinement factor $\Gamma$ of the active layer outside the stripe groove with respect to a laser beam in the fundamental transverse mode (i.e., in the guide mode) is closer to that within the stripe (0.23), compared with the optical confinement factor $\Gamma$ of the active layer outside the stripe groove with respect to a laser beam in the fundamental transverse mode (i.e., in the anti-guide mode). Because of this, in the above-mentioned semiconductor laser, a waveguiding function is established. In this way, the waveguide, which satisfies predetermined conditions regarding the optical confinement factor $\Gamma$ of the active layer and the difference in refractive index, is provided by regulating the mole fraction and the thickness of the laser beam transmission layer 107 (109) and the laser beam absorption layer 108. This waveguide can be provided under the condition that the current and light confining function is sufficiently maintained. According to the present invention, the waveguiding function and the current and light confining function can be achieved.

Figure 14:
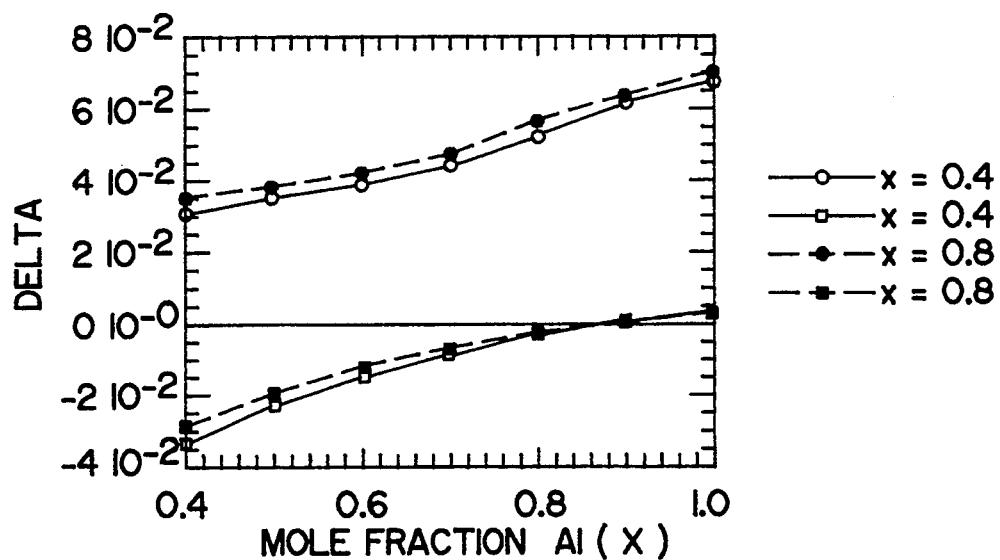
FIG. 14 is a graph showing the relationship between the Al mole fraction Al(x) of an $(Al_xGa_{1-x})0.5In_{0.5}P$ laser beam transmission layer 107 and the difference in equivalent refractive index within a stripe groove from that outside the stripe groove in Example 1.
Figure 15:
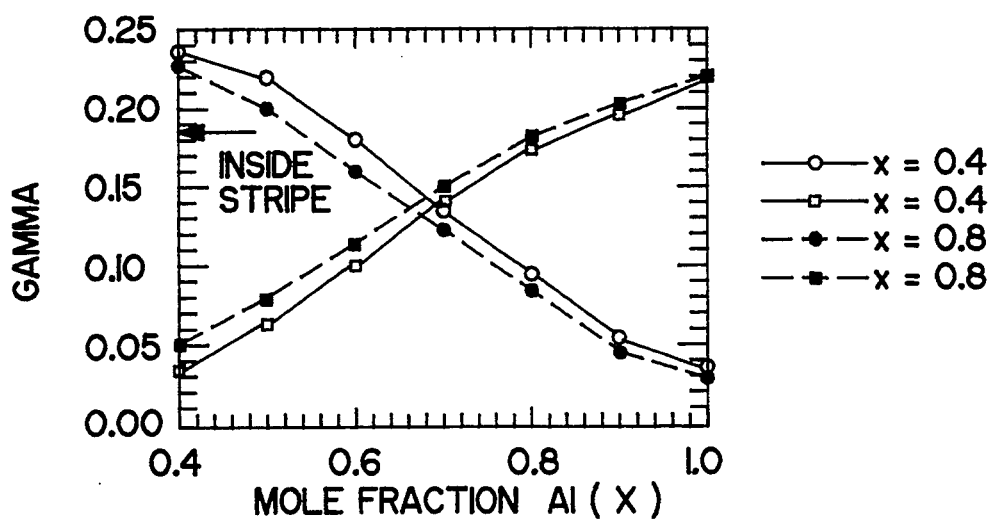
FIG. 15 is a graph showing the relationship between the Al mole fraction A1(x) of the $(Al_xGa_{1-x})0.5In0.5P$ laser beam transmission layer 107 and the optical confinement factor $\Gamma$ of a region outside a stripe groove of an active layer 103 provided below multi-layered confining portions 151a and 151b.

Regarding the $(Al_xGa_{1-x})_{0.5}In_{0.5}P$ semiconductor laser having each compound semiconductor layer shown in Table 2, the relationships corresponding to those shown in FIGS. 12 and 13 are shown in FIGS. 14 and 15. As is apparent from FIGS. 14 and 15, according to the semiconductor laser which has an Al mole fraction $Al(x)$ of the laser beam transmission layer 107 in the range of 0.4 to 0.72, the equivalent refractive index with respect to a laser beam in the fundamental transverse mode in the current and light confining portions 151a and 151b is smaller than that within the stripe groove (the difference in refractive index $\Delta n$ is larger than $1 \times 10^{-2}$). The optical confinement factor $\Gamma$ of the active layer outside the stripe groove with respect to a laser beam in the fundamental transverse mode (i.e., in the guide mode) is closer to that within the stripe groove (0.19), compared with the optical confinement factor $\Gamma$ of the active layer outside the stripe groove with respect to a laser beam in the fundamental transverse mode (i.e., in the anti-guide mode). Because of this, in this semiconductor laser, the waveguiding function is established.

According to Example 1 shown in FIG. 1, the laser beam transmission layers 107 and 109 are provided in the current and light confining section 150 in addition to the laser beam absorption layer 108. The mole fraction and the thickness of the laser beam transmission layers 107 and 109 are regulated, whereby the current confining function can be improved, and moreover the difference in equivalent refractive index within the stripe groove 152 from that outside the stripe groove 152 can be regulated in a wide range. More specifically, when the laser beam absorption layer 108 in the current and light confining section 150 absorbs a laser beam, minority carriers are generated. The minority carriers are prevented from being scattered by the laser beam transmission layers 107 and 109 provided in the current and light confining section 150. Because of this, a phototransistor effect caused by the scattering of the minority carriers is prevented; as a result, the current and light confining function of the current and light confining section 150 is not damaged by the absorption of the laser beam. In addition, it is not required that the laser beam absorption layer 108 is made thicker than a diffusion length of the minority carriers for the purpose of preventing a phototransistor effect. In particular, when the thickness of the laser beam absorption layer 108 is made equal to or less than a half of a reciprocal of the absorption coefficient (0.55 μm in Table 1) regarding the laser lasing wavelength, (e.g., according to the example of Table 1, the thickness of the laser beam absorption layer 108=0.1 μm), excess absorption of a laser beam in a transverse mode by the laser beam absorption layer 108 can be prevented. If the absorption loss of the laser beam in a transverse mode is reduced, high output operation due to a low driving current is made possible and the reliability during the high output operation is improved.

In the current and light confining section 150, the laser beam transmission layers 107 and 109, and the laser beam absorption layer 108 substantially function as a current and light confining layer. The total thickness of these layers can be made smaller than that of conventional examples by regulating the mole fraction and the thickness of the laser beam transmission layers 107 and 109. According to the example in Table 1, the total thickness including the laser beam absorption layer 108 is reduced to 0.4 μm. As a result, the depth of the stripe groove 152 can be reduced, and the stripe groove 152 can be formed with good controllability. Moreover, there is an advantage in that the difference in equivalent refractive index within the stripe groove 152 from that outside the stripe groove 152 can be set to a desired value by regulating the mole fraction and the thickness of the laser beam transmission layers 107 and 109, independently of other structural parameters. In particular, the laser beam transmission layer 109 is provided in addition to the laser beam transmission layer 107, whereby the difference in equivalent refractive index within the stripe groove 152 from that outside the stripe groove 152 and absorption loss can be more freely determined.

As a result of the decrease in the absorption loss for the above-mentioned reasons, the high output operation is made possible even at a low driving current. In addition, due to the decrease in the absorption loss outside the stripe groove 152, the delay of a wave surface outside the stripe groove 152 can be prevented. According to the example in Table 1, the delay of a wave surface is decreased to $\frac{1}{2}$ to $\frac{1}{3}$ of that of conventional examples. Since the astigmatisa is reduced in this way, the optical characteristics of a laser beam emitted from the semiconductor laser can be improved.

Next, the effects of the epitaxial growth promoting layers 105a and 105b, the etching stop layer 106, and the epitaxial growth promoting layer 110 will be described.

As described before, due to the etching stop layer 106, the depth of the stripe groove 152 can be adjusted to a set value with good controllability.

According the present example, after the stripe groove 152 is formed by etching, the cladding layer 111 and the contact layer 112 are grown so as to cover the current and light confining portions 151a and 151b, and the stripe groove 152 by the epitaxial growth method. A growth interface within the stripe groove 152 (i.e., the interface between the cladding layer 111 and the second cladding layer 104) is covered with a layer (i.e., the epitaxial growth promoting layer 105b) which does not contain Al at a high concentration, whereby the interface can be kept clean. As a result, the epitaxial growth layers, which are formed after the formation of the stripe groove 152, can be maintained with high quality.

It is preferred that the band gap of the epitaxial growth promoting layer 105b is made larger than that of the active layer 103 so that the epitaxial growth promoting layer 105b does not absorb a laser beam. According to the example of Table 1, since the thickness of the epitaxial growth promoting layer 105b is about 3 nm, the band gap thereof is increased due to the quantum effect and is made larger than that of the active layer 103. Since the epitaxial growth promoting layer 105b is thin (i.e., 3 nm), the epitaxial growth promoting layer 105a is provided so that the second cladding layer 104 with a high mole fraction is not exposed even though pinholes and the like are formed on the epitaxial growth promoting layer 105b.

Example 2

Figure 6:
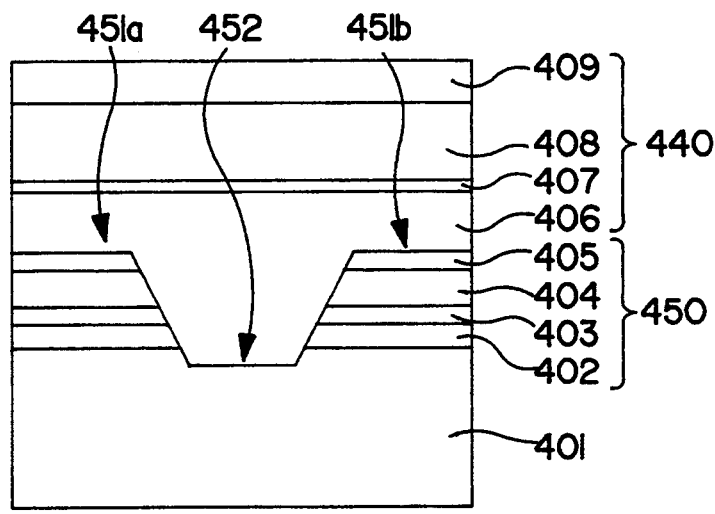
FIG. 6 is a cross-sectional view of a second example of a laser according to the present invention.

FIG. 6 is a cross-sectional view of another semiconductor laser of the present invention. The semiconductor laser shown in FIG. 6 includes a semiconductor substrate 401, a current and light confining section 450 formed on the semiconductor substrate 401, and a multi-layered structure 440 formed on the current and light confining section 450.

The current and light confining section 450 includes two multi-layered current and light confining portions 451a and 451b, and one stripe groove 452 which spatially divides the current and light confining section 450 into the current and light confining portions 451a and 451b. The multi-layered current and light confining portions 451a and 451b include a laser beam transmission layer 402, a laser beam absorption layer 403, a laser beam transmission layer 404, and an epitaxial growth promoting layer 405 in this order from the bottom.

The multi-layered structure 440 include a first cladding layer 406, an active layer 407, a second cladding layer 408, and a contact layer 409 in this order from the bottom.

The band gap of the laser beam transmission layers 402 and 404 is made larger than that of the active layer 407 so that the laser beam transmission layers 402 and 404 allow a laser beam to transmit therethrough. The band gap of the laser beam absorption layer 403 is made smaller than that of the active layer 407 so that the laser beam absorption layer 403 absorbs a laser beam. Each compound semiconductor layer is formed, for example, by the LPE method.

Table 3 shows an example of a mole fraction and a thickness of each compound semiconductor layer forming the semiconductor laser of FIG. 6.

TABLE 3

| 401 | p-GaAs | |
|---|---|---|
| 402 | n-Al$_x$Ga$_{1-x}$As(x = 0.5) | $d_{402}$ = 0.2 μm |
| 403 | n-GaAs | $d_{403}$ = 0.1 μm |
| 404 | n-Al$_x$Ga$_{1-x}$As(x = 0.2) | $d_{404}$ = 0.1 μm |
| 405 | n-GaAs | $d_{405}$ = 0.05 μm |
| 406 | p-Al$_x$Ga$_{1-x}$As(x = 0.5) | $d_{406}$ = 0.1 μm |
| 407 | Al$_x$Ga$_{1-x}$As(x = 0.13) | $d_{407}$ = 0.1 μm |
| 408 | n-Al$_x$Ga$_{1-x}$As(x = 0.5) | $d_{408}$ = 1.0 μm |
| 409 | n-GaAs | $d_{409}$ = 1.0 μm |

In the Al$_x$Ga$_{1-x}$As semiconductor laser having each compound semiconductor layer shown in Table 3, a laser beam with a lasing wavelength of 780 nm is obtained.

Figure 7:
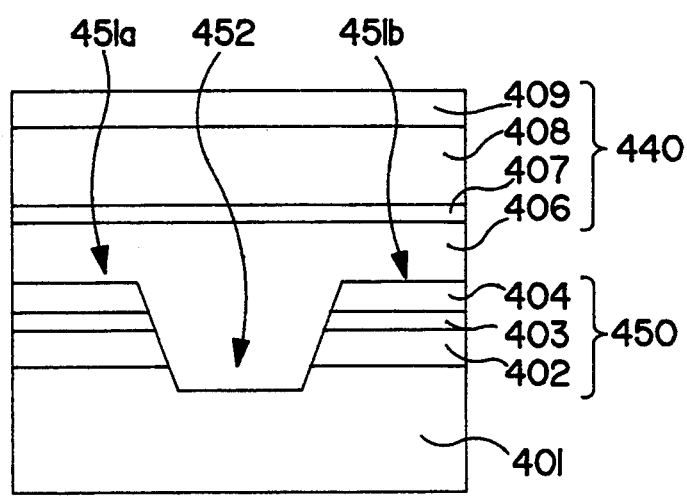
FIG. 7 is a cross-sectional view of main portions of the second example illustrating the function thereof.
Figure 8:
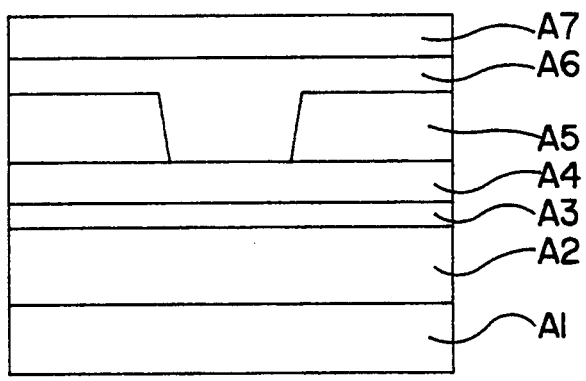
FIG. 8 is a cross-sectional view of a conventional semiconductor laser.
Figure 9:
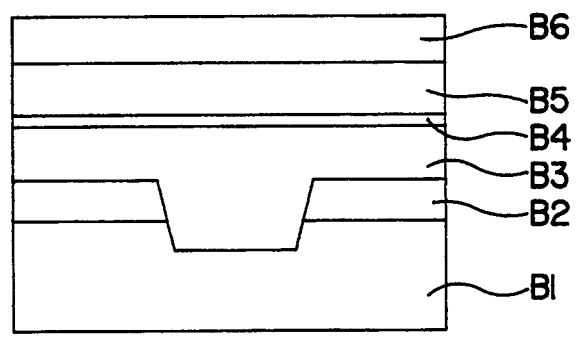
FIG. 9 is a cross-sectional view of another conventional semiconductor laser.
Figure 10:
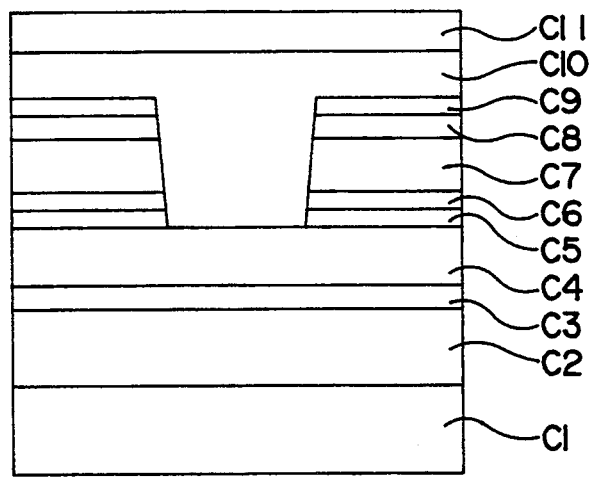
FIG. 10 is a cross-sectional view of still another semiconductor laser.
Figure 11:
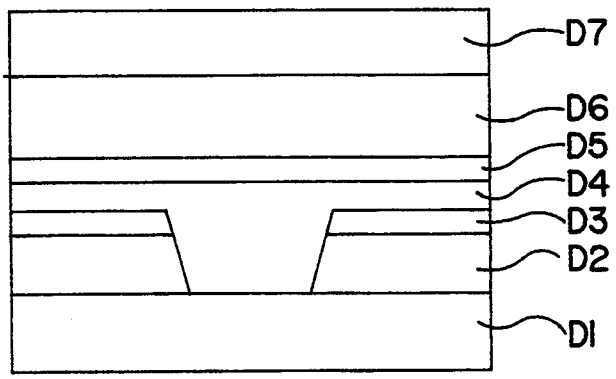
FIG. 11 is a cross-sectional view of still another semiconductor laser.

The epitaxial growth promoting layer 405 is not required for the present invention, so that the effects of the present invention can be obtained without the epitaxial growth promoting layer 405. FIG. 7 is a cross-sectional view of main portions of FIG. 6, illustrating the function thereof. In this FIGURE, only the main portions required for the present example are shown.

According to the present example, the laser beam transmission layer 402, the laser beam absorption layer 403, the laser beam transmission layer 404, the epitaxial growth promoting layer 405 are grown on the semiconductor substrate 401, and then a stripe groove 452 is formed by etching. After the stripe groove 452 is formed by etching, the first cladding layer 406, the active layer 407, the second cladding layer 408, and the contact layer 409 are formed by the epitaxial growth. A growth interface outside the stripe groove 452 is covered with, for example, a GaAs layer (i.e., the epitaxial growth promoting layer 405) which does not contain Al at high concentration, whereby the interface between the epitaxial growth layers such as the first cladding layer 406 and the laser beam transmission layer 404 is kept clean. As a result, the epitaxial growth layers such as the first cladding layer 406 can be maintained with high quality.

As described above, according to each example of the present invention, Problems 1 to 4 of the prior art can be overcome.

According to the present invention, the laser beam transmission layer is provided in the current and light confining section in addition to the laser beam absorption layer, and the mole fraction and the thickness of the laser beam transmission layer are regulated. Thus, the current and light confining function is improved and the equivalent refractive index within the stripe groove from that outside the stripe groove can be regulated in a wide range.

More specifically, when the laser beam absorption layer in the current and light confining section absorbs a laser beam, minority carriers are generated. The minority carriers are prevented from being diffused by the laser beam transmission layers provided in the current and light confining section. Because of this, the operation of the phototransistor caused by the diffusion of the minority carriers is prevented; as a result, the current confining function of the current and light confining section is not damaged by the absorption of the laser beam. In addition, it is not required that the laser beam absorption layer is made thicker than a diffusion length of the minority carriers for the purpose of preventing the operation of the phototransistor. In particular, when the thickness of the laser beam absorption layer is made equal to or less than a half of a reciprocal of the absorption coefficient with respect to the laser lasing wavelength, excess absorption of a horizontal transverse mode laser beam by the laser beam absorption layer can be prevented. If the absorption loss of the transverse mode is reduced, high output operation due to a low driving current is made possible and the reliability during the high output operation is improved.

As a result of the decrease in absorption loss, the high output operation is made possible even at a low driving current. Moreover, due to the decrease in absorption loss outside the stripe groove, the delay of a wave surface outside the stripe groove can be prevented. In this way, the astigmatism is reduced, so that the optical characteristics of a laser beam emitted from the semiconductor laser can be improved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser comprising a semiconductor substrate, a multi-layered structure formed on the semiconductor substrate and a current and light confining means formed on the multi-layered structure,
   wherein the current and light confining means includes at least two multi-layered current and light confining portions each having a laser beam transmission layer and a laser beam absorption layer formed on the laser beam transmission layer, and at least one stripe groove which spatially separates the at least two current and light confining portions;

wherein an equivalent refractive index in the multi-layered current and light confining portions with respect to a laser beam in a fundamental transverse mode is made smaller than that within the stripe groove;

wherein the multi-layered structure includes an active layer, and the active layer has a region positioned below the stripe groove of the current and light confining means and regions positioned below a respective one of the multi-layered current and light confining portions; and wherein an optical confinement factor $\Gamma$ of the active layer outside the stripe groove with respect to a laser beam in a guide mode is larger than that outside the stripe groove with respect to a laser beam in an anti-guide mode.

2. A semiconductor laser according to claim 1, wherein the multi-layered current and light confining portions further include another laser beam transmission layer formed adjacent to the laser beam absorption layers.

3. A semiconductor laser according to claim 1, wherein a refractive index in the laser beam transmission layer is smaller than the equivalent refractive index in the multi-layered current and light confining portions with respect to the laser beam in the fundamental transverse mode.

4. A semiconductor laser according to claim 2, wherein at least either one of the refractive index of the laser beam transmission layer or the equivalent refractive index of the another laser beam transmission layer is smaller than the equivalent refractive index in the multi-layered current and light confining portions with respect to the laser beam in the fundamental mode.

5. A semiconductor laser according to claim 1, wherein a band gap of the laser beam transmission layer is larger than that of the active layer, and a band gap of the laser beam absorption layer is smaller than that of the active layer.

6. A semiconductor laser according to claim 2, wherein any of the band gap of the laser beam transmission layer and the another laser beam transmission layer is larger than that of the active layer, and the band gap of the laser beam absorption layer is smaller than that of the active layer.

7. A semiconductor laser according to claim 4, wherein any of the band gap of the laser beam transmission layer and the another laser beam transmission layer is larger than that of the active layer, and the band gap of the laser beam absorption layer is smaller than that of the active layer.

8. A semiconductor laser according to claim 1, wherein a thickness of the laser beam absorption layer is equal to or less than $\frac{1}{2}$ of a reciprocal of an absorption coefficient of the laser beam absorption layer with respect to a laser lasing wavelength.

9. A semiconductor laser according to claim 1, wherein the thickness of the laser beam absorption layer is equal to or less than a diffusion length of minority carriers in the laser beam absorption layer.

10. A semiconductor laser according to claim 1, wherein the multi-layered structure, the laser beam transmission layer, and the laser beam absorption layer are $Al_xGa_{1-x}As$ layers; and wherein a mole fraction x of the laser beam transmission layer is set so that an optical confinement factor $\Gamma$ of the active layer outside the strip groove with respect to the laser beam in the guide mode is made larger than that outside the stripe groove with respect to the laser beam in the anti-guide mode.

11. A semiconductor laser according to claim 1, wherein the multi-layered structure, the laser beam transmission layer, and the laser beam absorption layer are $(Al_xGa_{1-x})_{0.5}In_{0.5}P$ layers; and wherein a mole fraction x of the laser beam transmission layer is set so that an optical confinement factor $\Gamma$ of the active layer outside the stripe groove with respect to the laser beam in the guide mode is made larger than that outside the stripe groove with respect to the laser beam in the anti-guide mode.

12. A semiconductor laser comprising a semiconductor substrate, a current and light confining means formed on the semiconductor substrate, and a multi-layered structure formed on the current and light confining means, wherein the current and light confining means includes at least two multi-layered current and light confining portions having a laser beam absorption layer and a laser beam transmission layer formed on the laser beam absorption layer, and at least one strip groove which spatially separates the current and light confining portions;

wherein an equivalent refractive index in the multi-layered current and light confining portions with respect to a laser beam in a fundamental transverse mode is made smaller than that within the stripe groove;

wherein the multi-layered structure includes an active layer, and the active layer has a region positioned above the stripe groove of the current and light confining means and regions positioned above a respective one of the multi-layered current and light confining means and regions positioned above a respective one of the multi-layered current and light confining portions; and wherein an optical confinement factor $\Gamma$ of the active layer outside the stripe groove with respect to a laser beam in a guide mode is larger than that outside the stripe groove with respect to a laser beam in an anti-guide mode.

13. A semiconductor laser according to claim 12, wherein the multi-layered current and light confining portions further include another laser beam transmission layer formed adjacent to the laser beam absorption layer.

14. A semiconductor laser according to claim 12, wherein a refractive index in the laser beam transmission layer is smaller than the equivalent refractive index in the multi-layered current and light confining portions with respect to the laser beam in the fundamental transverse mode.

15. A semiconductor laser according to claim 13, wherein at least either one of the refractive index of the laser beam transmission layer or the equivalent refractive index of the another laser beam transmission layer is smaller than the equivalent refractive index in the multi-layered current and light confining portions with respect to the laser beam in the fundamental mode.

16. A semiconductor laser according to claim 12, wherein a band gap of the laser beam transmission layer is larger than that of the active layer, and a band gap of the laser beam absorption layer is smaller than that of the active layer.

17. A semiconductor laser according to claim 3, wherein a band gap of the laser beam transmission layer is larger than that of the active layer, and a band gap of the laser beam absorption layer is smaller than that of the active layer.

18. A semiconductor laser according to claim 14, wherein a band gap of the laser beam transmission layer is larger than that of the active layer, and a band gap of the laser beam absorption layer is smaller than that of the active layer.

19. A semiconductor laser according to claim 13, wherein any of the band gap of the laser beam transmission layer and the another laser beam transmission layer is larger than that of the active layer, and the band gap of the laser beam absorption layer is smaller than that of the active layer.

20. A semiconductor laser according to claim 15, wherein any of the band gap of the laser beam transmission layer and the another laser beam transmission layer is larger than that of the active layer, and the band gap of the laser beam absorption layer is smaller than that of the active layer.

21. A semiconductor laser according to claim 12, wherein a thickness of the laser beam absorption layer is equal to or less than $\frac{1}{2}$ of a reciprocal of an absorption coefficient of the laser beam absorption layer with respect to a laser lasing wavelength.

22. A semiconductor laser according to claim 12, wherein the thickness of the laser beam absorption layer is equal to or less than a diffusion length of minority carriers in the laser beam absorption layer.

23. A semiconductor laser according to claim 12, wherein the multi-layered structure, the laser beam transmission layer, and the laser beam absorption layer are $Al_xGa_{1-x}As$ layers; and wherein a mole fraction x of the laser beam transmission layer is set so that an optical confinement factor $\Gamma$ of the active layer outside the stripe groove with respect to the laser beam in the guide mode is made larger than that outside the stripe groove with respect to the laser beam in the anti-guide mode.

24. A semiconductor laser according to claim 12, wherein the multi-layered structure, the laser beam transmission layer, and the laser beam absorption layer are $(Al_xGa_{1-x})_{0.5}In_{0.5}P$ layers; and wherein a mole fraction x of the laser beam transmission layer is set so that an optical confinement factor $\Gamma$ of the active layer outside the stripe groove with respect to the laser beam in the guide mode is made larger than that outside the stripe groove with respect to the laser beam in the anti-guide mode.

* * * * *

UNITED STATES PATENT AND TRADEMARK OFFICE
CERTIFICATE OF CORRECTION

PATENT NO. : 5,361,271
DATED : November 1, 1994
INVENTOR(S) : Haruhisa Takiguchi, et al.

It is certified that error appears in the above-indentified patent and that said Letters Patent is hereby corrected as shown below:

Column 7, line 11: "FIG. is" should read --FIG. 1 is--;

line 48: "$(Al_xGa_{1-x})0.5In_{0.5}P$" should read --$(Al_xGa_{1-x})_{0.5}In_{0.5}P$--;

line 54: "$(Al_xGa_{1-x})0.5In0.5P$" should read --$(Al_xGa_{1-x})_{0.5}In_{0.5}P$--;

column 11, line 31: "layer 103 $(n \geq n_{eq})$." should read --layer 103 $(n \leq n_{eq})$.--;

column 15, line 48: "$Al_xGa_{1-x}xAs$" should read --$Al_xGa_{1-x}As$--.

Signed and Sealed this

Eighth Day of August, 1995

*Attest:*

BRUCE LEHMAN

*Attesting Officer*    *Commissioner of Patents and Trademarks*

UNITED STATES PATENT AND TRADEMARK OFFICE
CERTIFICATE OF CORRECTION

PATENT NO. : 5,361,271

DATED : November 1, 1994

INVENTOR(S) : Haruhisa Takiguchi et al.

It is certified that error appears in the above-identified patent and that said Letters Patent is hereby corrected as shown below:

On the title page, item [73] Assignee:

should read--    Sharp Kabushiki Kaisha, Osaka, Japan --

Signed and Sealed this

Twenty-eighth Day of November 1995

Attest:

BRUCE LEHMAN

*Attesting Officer*    *Commissioner of Patents and Trademarks*

UNITED STATES PATENT AND TRADEMARK OFFICE
CERTIFICATE OF CORRECTION

PATENT NO. : 5,361,271
DATED : November 1, 1994
INVENTOR(S) : Haruhisa Takiguchi, et al.

It is certified that error appears in the above-indentified patent and that said Letters Patent is hereby corrected as shown below:

On the title page, item [73] Assignee:

should read-- Sharp Kabushiki Kaisha, Osaka, Japan --.

This certificate supersedes Certificate of Correction issued November 28, 1995.

Signed and Sealed this

Eighteenth Day of June, 1996

Attest:

BRUCE LEHMAN

*Attesting Officer*        *Commissioner of Patents and Trademarks*